(12) United States Patent
Shimoda et al.

(10) Patent No.: US 8,013,270 B2
(45) Date of Patent: Sep. 6, 2011

(54) LASER PROCESSING APPARATUS, LASER PROCESSING METHOD, MANUFACTURING METHOD OF WIRING SUBSTRATE, MANUFACTURING METHOD OF DISPLAY APPARATUS AND WIRING SUBSTRATE

(75) Inventors: Kazuhito Shimoda, Kanagawa (JP); Ryo Koshiishi, Kanagawa (JP); Satoshi Tomioka, Kumamoto (JP); Hideo Kawabe, Saitama (JP)

(73) Assignee: Sony Corporation, Tokyo (JP)

( * ) Notice: Subject to any disclaimer, the term of this patent is extended or adjusted under 35 U.S.C. 154(b) by 1013 days.

(21) Appl. No.: 11/860,199

(22) Filed: Sep. 24, 2007

(65) Prior Publication Data

US 2008/0085413 A1 Apr. 10, 2008

(30) Foreign Application Priority Data

Oct. 6, 2006 (JP) ............................... P2006-275322
Jan. 10, 2007 (JP) ............................... P2007-002585

(51) Int. Cl.
*B23K 26/04* (2006.01)
*A61N 5/00* (2006.01)
(52) U.S. Cl. .................................. 219/121.6; 250/492.3
(58) Field of Classification Search .. 219/121.6–121.86; 250/492.1, 492.2, 492.3
See application file for complete search history.

(56) References Cited

U.S. PATENT DOCUMENTS

| | | | | |
|---|---|---|---|---|
| 5,055,696 | A | * 10/1991 | Haraichi et al. | ............ 250/492.2 |
| 5,073,687 | A | * 12/1991 | Inagawa et al. | ............ 219/121.7 |
| 6,972,268 | B2 | * 12/2005 | Ehrmann et al. | ............ 438/795 |
| 7,323,816 | B2 | 1/2008 | Lovell | |

FOREIGN PATENT DOCUMENTS

| | | |
|---|---|---|
| JP | 63-056391 | 3/1988 |
| JP | 11-282010 | 10/1999 |
| JP | 2001-077198 | 3/2001 |
| JP | 2004-199956 | 7/2004 |
| JP | 2005-513741 | 5/2005 |

OTHER PUBLICATIONS

Japanese Office Action dated Aug. 19, 2008 for Application No. 2007-002585.

* cited by examiner

*Primary Examiner* — Sang Y Paik
(74) *Attorney, Agent, or Firm* — SNR Denton US LLP

(57) ABSTRACT

A laser processing apparatus includes a support table, a local exhaust device, and a laser light source unit. The support table supports a processing object. The local exhaust device directs laser light into a local exhaust unit in which pressure is locally adjusted over the support table. The laser light source unit outputs the laser light. The local exhaust device is capable of relatively being lifted from the support table by injecting a lift gas to the support table. The processing object includes a multilayer film formed of two or more layers with different materials. An input unit into which reflectance of the processing object is inputted is connected to the laser light source unit.

12 Claims, 11 Drawing Sheets ly-LASER PROCESSING APPARATUS, LASER
PROCESSING METHOD, MANUFACTURING
METHOD OF WIRING SUBSTRATE,
MANUFACTURING METHOD OF DISPLAY
APPARATUS AND WIRING SUBSTRATE

CROSS REFERENCES TO RELATED APPLICATIONS

The present invention contains subject matter related to Japanese Patent Application JP 2006-275322 filed in the Japanese Patent Office on Oct. 6, 2006 and Japanese Patent Application JP 2007-002585 filed in the Japanese Patent Office on Jan. 10, 2007, the entire contents of which being incorporated herein by reference.

BACKGROUND OF THE INVENTION

1. Field of the Invention

The present invention relates to a laser processing apparatus, a laser processing method that can be carried out by using the laser processing apparatus, a method of manufacturing a wiring substrate by the laser processing method, a method of manufacturing a display apparatus including the wiring substrate and a wiring substrate obtained by the laser processing method.

2. Description of the Related Art

Structures produced on the assumption of mass-production have predetermined structure patterns determined in response to purposes. Such a structure may be a wiring substrate including members (wires, etc.) and devices (capacitors, etc.) or a photomask. Also, a structure including a wiring substrate and which uses a photomask in the manufacturing process may be a display apparatus such as a flat display panel display (FPD).

However, predetermined patterns may be incompletely formed on these structures in the manufacturing process and it is frequently observed that members and devices are formed excessively (for example, extended to the outside of a predetermined area) or formed insufficiently (for example, not formed uniformly within the predetermined area).

A specific example will be described using a display apparatus.

A display apparatus (for example, flat panel display) has a picture screen formed of a large number of pixels arrayed in a two-dimensional matrix (XY-matrix) and it has excellent characteristics such as thin, light-weight and low power consumption. Such display apparatuses are classified based on driving systems. An active matrix display apparatus in which a switching element is electrically connected to each pixel electrode can suppress crosstalk occurred between adjacent pixels and therefore has, particularly, excellent image quality (image). For this reason, active matrix display apparatuses have been studied and developed and are widely used as display apparatuses for a personal computer (PC), a television receiver (TV) and other electronic apparatuses. It should be noted that flat panel displays are classified into a liquid crystal display, an organic EL (electroluminescence) display and so on depending on light-emitting systems.

An active matrix display apparatus includes a transparent insulated substrate such as made of glass on which is formed a wiring substrate (or matrix array substrate or array substrate) constructed by stacking lower-layer metal wiring patterns (for example, a plurality of scanning lines), insulating films and upper-layer metal wiring patterns (for example, a plurality of signal lines).

The lower-layer metal wiring patterns and the upper-layer metal wiring patterns extend in the directions perpendicular to each other, are arranged in the form of a lattice. The position corresponding to each cell (intersection) of the lattice may serve as a pixel. The upper-layer metal wiring pattern is connected to a pixel electrode made of a transparent conductive material such as ITO (Indium-Tin-Oxide). Also, each pixel is provided with a switching element that can control the electrode. In the case where this switching element is a thin film transistor (TFT), the gate electrode is electrically connected to the scanning line, the drain electrode is electrically connected to the signal line and the source electrode is electrically connected to the pixel electrode.

Local failure such as defect of an insulating film and disconnection of metal wiring may frequently occur in such wiring substrate. An interlayer short-circuit may be a specific example of local failure. In the interlayer short-circuit, the upper-layer wiring and the lower-layer wiring are caused to electrically connect at the position at which the upper-layer wiring pattern and the lower-layer wiring pattern intersect each other or overlap with each other due to defects of the insulating film and mixing of a non-insulating foreign matter.

If the above local failure occurs in the wiring substrate, then a part of pixels becomes a pixel that stops lighting or a plurality of pixels become a line of pixels that stop lighting in the display apparatus, for example, so that the performance of such image display deteriorates considerably. For this reason, while control of manufacture processes is attempted (reduction of foreign matter, suppression of defect, etc.) to suppress occurrence of such local failure, it is difficult to completely prevent the occurrence of local failures.

Japanese Unexamined Patent Application Publication No. 2001-77198 discloses a method of correcting an interlayer short-circuit at the position in which an upper-layer wiring pattern and an lower-layer wiring pattern intersect each other or overlap with each other. This method is used to correct the interlayer short-circuit at the position in which the upper-layer wiring pattern and the lower-layer wiring pattern intersect each other or overlap with each other. However, since it has been difficult to carry out laser cutting only on the upper-layer wiring pattern in the interlayer short-circuit portion, the interlayer short-circuit is corrected by laser cutting and a bypass wiring process in other areas than the intersecting portion, so that the process is complicated.

Also, Japanese Unexamined Patent Application Publication No. H11-282010 discloses a method that corrects short-circuit between upper-layer wiring patterns. This method is able to correct short-circuit between the upper wiring patterns. However, when the area that should be cut by laser exists also in the lower wiring portion, occurrence of an interlayer short-circuit caused between the upper layer and the lower layer may not always be prevented, because the lower layer also should be cut by laser. As a result, influence of the interlayer short-circuit portion should be removed by cutting other areas with laser and the process is complicated.

As described above, the correcting methods according to related-art are complicated in process and have other disadvantages such as long manufacture throughput.

Also, in the related-art correcting methods, a film thickness of a multilayer film in the wiring substrate has been determined to obtain a small-sized apparatus from the viewpoints of miniaturization and thin apparatuses. On the other hand, the inventors of the present application have found out that laser processing may be optimized only within a range in which correction is determined by a film thickness, if correction is carried out based on an established film thickness. Specifically, the inventors of the present application have found out that a wavelength of laser light or the like should be selected to carry out optimum laser processing without restrictions of the established film thickness.

SUMMARY OF THE INVENTION

It is desirable to provide a simplified and reliable laser processing method in which both of improvement of a manufacture yield and reduction of manufacture throughput are obtained, a method of manufacturing a wiring substrate using the laser processing method, a method of manufacturing a display apparatus including the wiring substrate, and a laser processing apparatus.

According to an embodiment of the present invention, there is provided a laser processing apparatus including a support table, a local exhaust device, and a laser light source unit. The support table supports a processing object. The local exhaust device directs laser light into a local exhaust unit in which pressure is locally adjusted over the support table. The laser light source unit outputs the laser light. The local exhaust device is capable of relatively being lifted from the support table by injecting a lift gas to the support table. The processing object includes a multilayer film formed of two or more layers with different materials. An input unit into which reflectance of the processing object is inputted is connected to the laser light source unit.

According to another embodiment of the present invention, there is provided a laser processing method for irradiating a processing object with laser light. The laser processing method includes the steps of selecting a wavelength of the laser light based on a reflectance of a multilayer film formed of two or more layers with different materials; and irradiating the processing object with the laser light to perform laser processing.

According to a further embodiment of the present invention, there is provided a method of manufacturing a wiring substrate by laser processing. The wiring substrate is manufactured through irradiating a multilayer film formed of two or more layers with different materials constituting the wiring substrate with laser light a wavelength of which is selected based on a reflectance of the multilayer film.

According to still another embodiment of the present invention, there is provided a method of manufacturing a display apparatus including a wiring substrate. The wiring substrate is manufactured through irradiating a multilayer film formed of two or more layers with different materials constituting the wiring substrate with laser light a wavelength of which is selected based on reflectance of the multilayer film.

According to yet another embodiment of the present invention, there is provided a wiring substrate manufactured through irradiating a multilayer film formed of two or more layers with materials different from each other with laser light a wavelength of which is selected based on reflectance of the multilayer film.

According to the embodiment of the laser processing apparatus of the present invention, the laser processing apparatus includes a support table, a local exhaust device, and a laser light source unit. The support table supports a processing object. The local exhaust device directs laser light into a local exhaust unit in which pressure is locally adjusted over the support table. The laser light source unit outputs the laser light. The local exhaust device is capable of relatively being lifted from the support table by injecting a lift gas to the support table. The processing object includes a multilayer film formed of two or more layers with different materials. An input unit into which reflectance of the processing object is inputted is connected to the laser light source unit. Accordingly, simplified and reliable laser processing can be carried out, thereby improving a manufacture yield and reducing manufacture throughput.

According to the embodiment of the laser processing method of the present invention, the wavelength of laser light is selected based on the reflectance of the multilayer film formed of two or more layers with different materials in the processing object. Accordingly, simplified and reliable laser processing can be carried out, thereby improving a manufacture yield and reducing manufacture throughput.

According to the embodiment of the method of manufacturing the wiring substrate of the present invention, the wiring substrate is manufactured through irradiating a multilayer film formed of two or more layers with different materials constituting the wiring substrate with laser light a wavelength of which is selected based on a reflectance of the multilayer film. Accordingly, simplified and reliable laser processing can be carried out, thereby improving a manufacture yield and reducing manufacture throughput.

According to the embodiment of the method of manufacturing the display apparatus of the present invention, the wiring substrate is manufactured through irradiating a multilayer film formed of two or more layers with different materials constituting the wiring substrate with laser light a wavelength of which is selected based on a reflectance of the multilayer film. Accordingly, simplified and reliable laser processing can be carried out, thereby improving a manufacture yield and reducing manufacture throughput.

According to the embodiment of the wiring substrate of the present invention, the wiring substrate is manufactured through irradiating a multilayer film formed of two or more layers with materials different from each other with laser light a wavelength of which is selected based on reflectance of the multilayer film. Accordingly, short-circuit can be removed reliably and characteristics can be improved.

DESCRIPTION OF THE PREFERRED EMBODIMENTS

Embodiments of the present invention will be described below with reference to the drawings.

Embodiment of Laser Processing Apparatus

A laser processing apparatus according to an embodiment of the present invention will be described below with reference to the drawings.

It should be noted that the embodiment of the laser processing apparatus is described using an apparatus for manufacturing a wiring substrate, where a wiring substrate such as a TFT (thin film transistor) substrate is used as a processing object, for example.

Figure 1A:
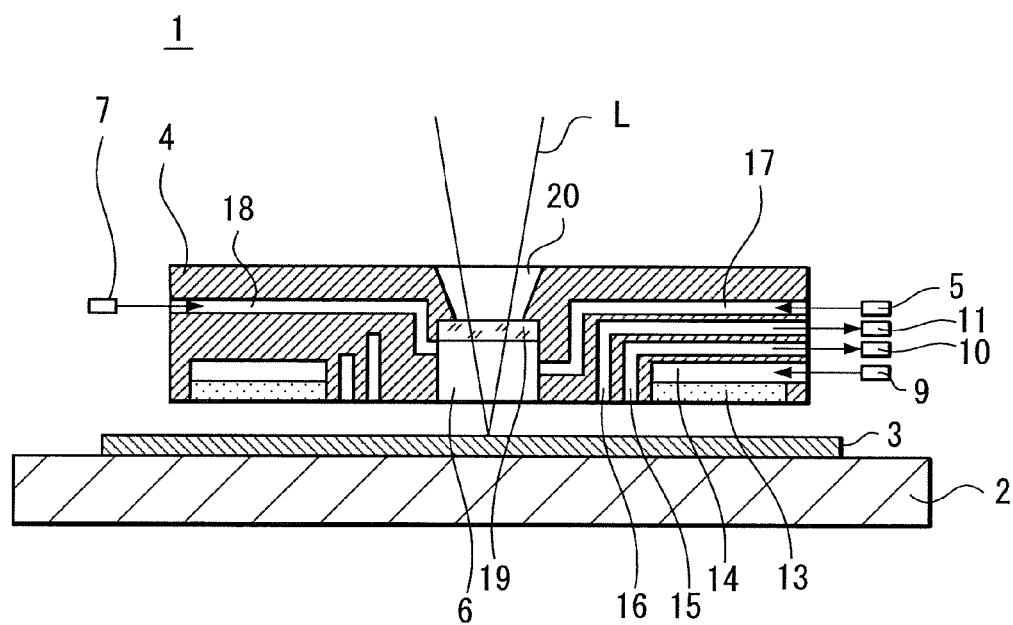
FIG. 1A is a schematic diagram showing an arrangement of a laser processing apparatus according to an embodiment of the present invention.
Figure 1B:
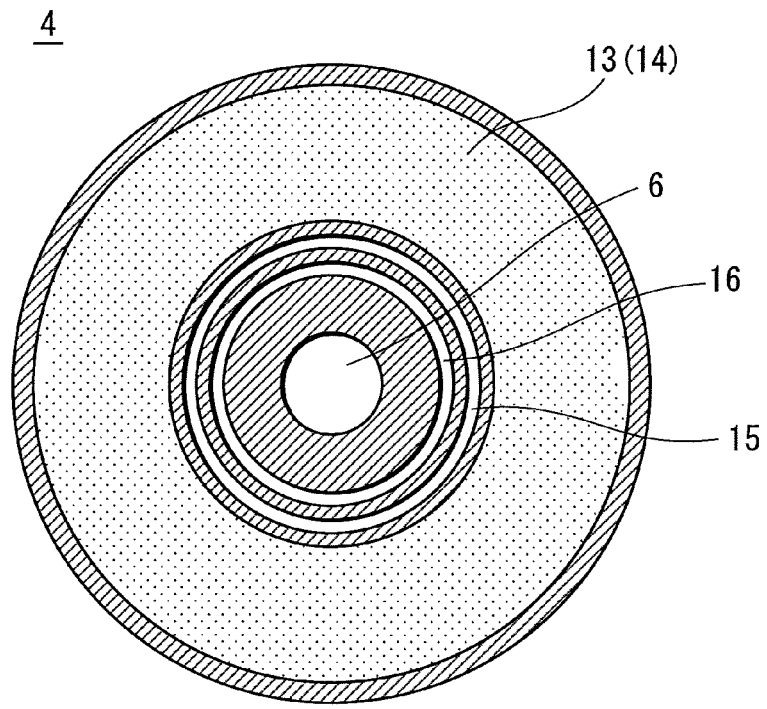
FIG. 1B is a bottom view showing a local exhaust device for use with the laser processing apparatus shown in FIG. 1A.

FIGS. 1A and 1B show schematic diagrams of a laser processing apparatus according to an embodiment of the present invention. A laser processing apparatus 1 according to the embodiment is an apparatus having at least a laser etching function, and particularly, according to the embodiment, the laser processing apparatus 1 has a film deposition function based on a laser CVD (chemical vapor deposition) method.

As shown in FIG. 1A, the laser processing apparatus 1 according to the embodiment includes a support table 2 and a local exhaust device 4. The support table 2 is a portion to support a processing object 3 when it is located thereon. The local exhaust device (local deposition etching head forming and etching a film in this embodiment, i.e., local processing head) 4 is arranged to face the processing object 3 supported on the support table 2 and locally forms a film thereon. It should be noted that the processing object 3 is a wiring substrate which includes at least a multilayer film formed of two or more layers made of different materials.

A lower portion at the center of the local exhaust device 4 serves as a local space (local exhaust portion 6 which will be described later) where pulse laser light L from a laser light source unit (not shown) is condensed and introduced and also a pressure is adjusted locally. The laser light source unit is connected with an input unit into which a reflectance of the multilayer film forming the processing object 3 is inputted.

A purge gas supply unit 7 that supplies a purge gas for the atmosphere is connected to the local exhaust portion 6. A raw material supply unit 5 is provided separately from the purge gas supply unit 7 and supplies a raw material gas. The raw material supply unit 5 and the purge gas supply unit 7 are respectively connected to the above-described local space through a raw material gas passage 17 and a purge gas passage 18, both of which are provided within the local exhaust device 4.

An opening of the purge gas passage 18 facing to the local exhaust portion 6 is slightly inclined toward a transparent window 19, thereby suppressing a smudge on the transparent window 19. Also, if a local exhaust unit (not shown) is connected to the local exhaust portion 6, an exhaust balance between exhaust units 10 and 11 is adjusted to generate a rising air current in the local exhaust portion 6. The rising air current may suppress redeposition of the material, which is removed and vaporized by etching, onto the processing object 3.

Further, a compressed gas supply unit 9 is connected to the local exhaust device 4. The compressed gas supply unit 9 lifts the local exhaust device 4 under static pressure by injecting a compressed argon (Ar) gas or nitrogen ($N_2$) gas, for example, to the support table 2. The compressed gas from the compressed gas supply unit 9 is uniformly injected toward the support table 2 facing the local exhaust device 4 through a ring-shaped compressed gas supply passage 14 and a porous gas permeable film 13 located at the opening portion of the ring-shaped compressed gas supply passage 14 that respectively serve as a supply passage and an air hole. An amount of lifting the local exhaust device (local film-deposition/etching head) 4 is determined by selecting a pressure and a flow rate of a compressed gas and selecting a balance between amounts of gases discharged by the respective exhaust units. Stability of lifting can be improved by selecting viscosity of a gas. Specifically, in the laser processing apparatus 1 according to the embodiment of the present invention, the local exhaust device 4 has a static-pressure floating pad arrangement.

According to the static-pressure floating pad arrangement, the local exhaust device 4 can be relatively displaced for the processing object 3 provided on the support table 2. Floating rigidity of static-pressure floating can be improved by adjusting the raw material supply unit 5, the local exhaust unit 6, the purge gas supply unit 7 and the like in addition to the compressed gas supply unit 9 and the exhaust units 10 and 11. Here, adsorption between the local exhaust device 4 and the processing object 3 represents floating rigidity. If floating rigidity is not sufficient, stability of height (gap) between the local exhaust device 4 and the processing object 3 may become insufficient, or mechanical or dynamic stability of the local exhaust device 4 may become insufficient. Therefore, it is preferable that sufficient floating rigidity should be maintained.

Upon actual processing, the local exhaust device 4 is lifted from the support table 2 to a height larger than the thickness of the processing object 3 by static-pressure floating. Therefore, when at least one of the support table 2 and the local exhaust device 4 is moved, it is possible to smoothly insert the processing object 3 below the local exhaust device 4.

A space between the local exhaust device 4 and the support table 2 may not be formed by static-pressure floating. However, when an inert gas is injected from the local exhaust device 4 to the support table 2, not only stable lift can be obtained but also flow of the air into the local exhaust unit 6 or scattering of a vaporized material or dusts generated in the local exhaust unit 6 upon laser etching can be decreased by a "gas curtain" action, so that cleanliness of the environment (clean room, etc.) around the apparatus can be maintained. Therefore, it is particularly preferable that a space should be formed between the local exhaust device 4 and the support table 2 by static-pressure floating using inert gas.

Also, in the case where the porous gas permeable film 13 is made of a porous material with a porosity of 40%, for example, the height of the local exhaust device 4, that is, an amount of lifting the local exhaust device 4 from the support table 2 can be adjusted in a wide range of about several μm to 100 μm by selecting an amount of injected inert gas. The porosity of the porous gas permeable film 13 is not limited to the above porosity of 40% and can be selected optionally. Also, a material of the porous gas permeable film 13 is not limited to porous aluminum (Al) and a desired material can be selected from materials of porous metal, ceramics, synthetic resin, etc.

FIG. 1B is a schematic bottom view of the local exhaust device 4 constituting the laser processing apparatus 1 according to the embodiment of the present invention.

The local exhaust device 4 includes ring-shaped suction grooves (discharge passages) 15 and 16 at the bottom thereof. The ring-shaped suction grooves 15 and 16 discharge excess amounts of the compressed gas injected to the support table 2 and gases (raw material gas, purge gas, etc.) supplied to the processing object 3 through the exhaust units 10 and 11. The aforementioned local space (local exhaust portion 6) is formed as an approximately cylindrical space facing to the bottom of the local exhaust device 4 and occupying the height from the transparent window 19 and a transmission hole 20 to the processing object 3. The local space (local exhaust portion 6) is provided on the inside of an approximately concentric ring-shaped portion formed by the suction grooves forming the end portions of the discharge passages 15 and 16.

According to the embodiment of the present invention, the laser processing apparatus 1 converges laser light L from, for example, a laser light source device (not shown) by a suitable device such as an objective lens and introduces the light through the transmission hole 20 with the transparent window 19 into the local exhaust portion 6. Subsequently, the laser processing apparatus 1 carries out processing of forming thin films by laser CVD (chemical vapor deposition) and processing of removing thin films by laser etching in the local exhaust portion 6.

On the other hand, while a desired pulse width can be selected for the pulse laser light L, a pulse width less than 10 picoseconds should preferably be selected, and it is particularly preferable that a pulse width of 1 picosecond or less called a femtosecond laser should be selected. If a pulse width is longer than 10 picoseconds, then heat is accumulated in the irradiated portion of the processing object 3 and diffused within the processing object 3, causing the irradiated portion to be melted at its peripheral portion that should be normally removed. It is frequently observed that the occurrence of such melt causes a vaporized material and dust to be produced. Hence, if an irradiation time of laser light per pulse is selected to be short, then it is possible to suppress occurrence and progress of melt by supplying intensive light energy during a time period shorter than a time period in which thermal diffusion takes place.

It should be noted that the pulse width should more preferably be selected in consideration of materials and members to be processed. For example, when a material intended to be removed from the processing object 3 (for example, part of excessively formed wires) is made of aluminum (Al), it is preferable that a pulse width in the range of about 2 picoseconds to 10 picoseconds, for example, should be selected as a suitable pulse width.

Also, wavelengths of desired values can be selected as a wavelength of pulse laser light L. On the other hand, an amount of droop caused by melting on the periphery of the irradiated portion of the processing object is determined by diffraction limit and an amount of droop tends to increase as a wavelength of pulse laser light increases. Therefore, in order to decrease the amount of droop at a boundary of laser cut portions, it is desirable to select laser light of a short wavelength. For example, laser light of a wavelength less than 390 nm or less may be suitable for the application.

Here, operations of forming thin films by laser CVD in the laser processing apparatus 1 shown in FIGS. 1A and 1B will be schematically described.

First, a compressed gas is supplied from the compressed gas supply unit (gas supply source) 9 to the compressed gas supply passage 14. Then, the compressed gas is injected through the porous gas permeable film 13 to the processing object 3 to lift the local exhaust device 4 from the processing object 3 by a predetermined space and the operation is started. At that time, a lift stage (not shown) with a thickness approximately equal to that of the processing object 3 and which is located in the vicinity of the processing object 3 is prepared at the position distant from the portion right under the local exhaust device 4. The local exhaust device 4 having been placed on this lift stage may be lifted and moved to the position above the processing object 3. As a result, when being moved above the processing object 3, the local exhaust device 4 can reliably avoid the contact with the processing object 3, which is preferable.

In such state, a raw material gas for the deposition of films is supplied from the raw material supply unit (gas supply source) 5 through the raw material gas passage 17 to the local exhaust unit 6 (that is, to the processing object 3 at its local portion on which a film is deposited). Also, a purge gas is supplied from the purge gas supply unit 7 through the purge gas passage 18 to the local exhaust unit 6. A carbonyl compound (tungsten carbonyl W $(CO)_6$, etc.) can be used as the raw material gas to deposit films.

Subsequently, a local portion of the processing object 3, on which a film is deposited, is irradiated with laser light L from the laser light source device. The local portion is irradiated with the laser light L through the transmission hole 20, the transparent window 19 and the local exhaust unit 6, thereby depositing a CVD film on the local portion of the processing object 3 based on thermal decomposition of the raw material gas.

Embodiments of Laser Processing Method, Wiring Substrate Manufacturing Method and Wiring Substrate Next, a laser processing method according to an embodiment of the present invention will be described. In this embodiment, the method will be described with reference to a case in which a wiring substrate is corrected (manufactured) by laser patterning. Also, the aforementioned laser processing apparatus (wiring substrate manufacturing apparatus) is used as a laser processing apparatus.

Figure 2A:
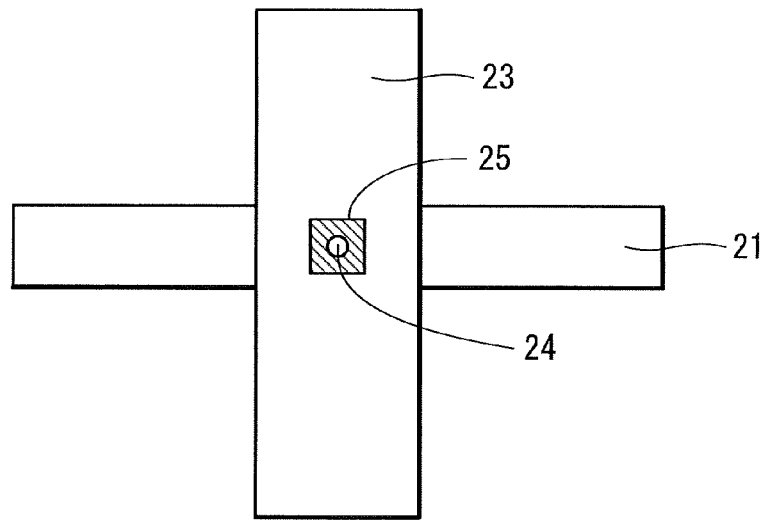
FIGS. 2A to 2C are respectively explanatory diagrams provided for explaining a laser processing method according to an embodiment of the present invention.
Figure 2B:
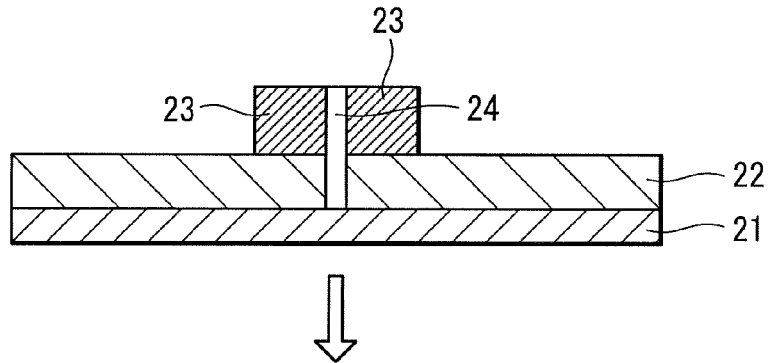

As shown in a top view of FIG. 2A and a cross-sectional view of FIG. 2B, a laser processing method (wiring substrate manufacturing method) according to the embodiment of the present invention can be applied the following case of correcting the wiring substrate. Here, a short-circuit portion (interlayer short-circuit) 24 has occurred at an intersecting portion between a lower-layer wiring 21 and an upper-layer wiring 23 having different heights due to a defect of an interlayer insulator 22 in a multilayer film formed by stacking the lower-layer wiring 21, the interlayer insulator 22 and the upper-layer wiring 22. Specifically, the laser processing method according to the embodiment of the present invention can be applied to such a case where a part including the short-circuit portion 24 is etched away by laser etching under predetermined conditions. A removed laser cut portion 25 is buried to form a defect correcting portion 26 if necessary, as shown in the top view of FIG. 2A and the cross-sectional view of FIG. 2C.

Figure 3A:
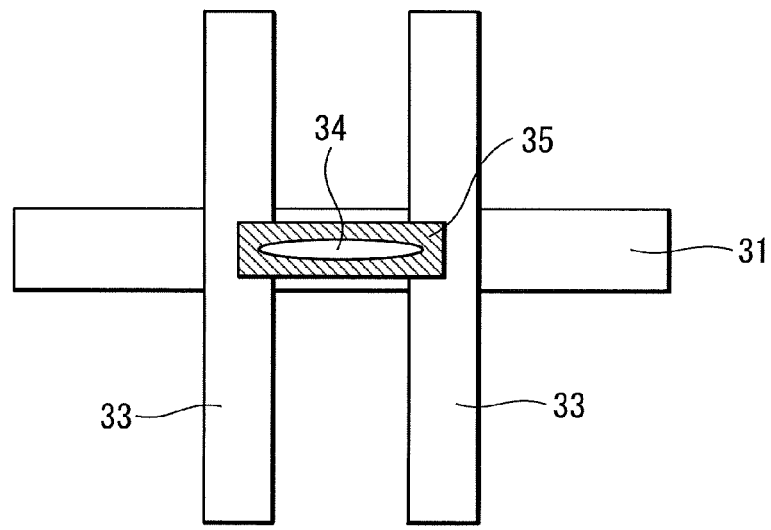
FIGS. 3A to 3C are respectively explanatory diagrams provided for explaining a laser processing method according to an embodiment of the present invention.
Figure 3B:
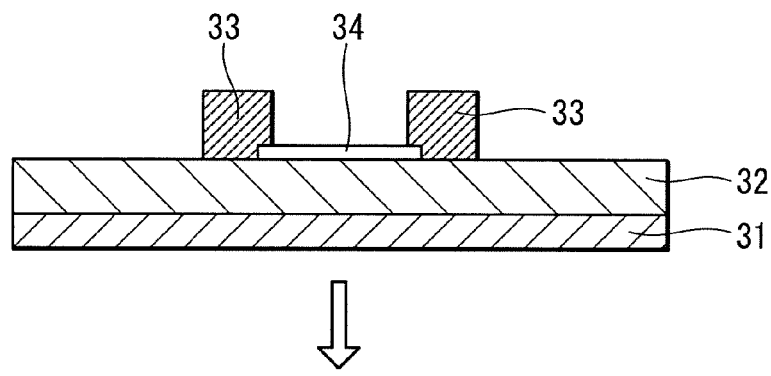

Also, as shown in a top view of FIG. 3A and a cross-sectional view of FIG. 3B, a laser processing method (wiring substrate manufacturing method) according to the embodiment of the present invention can be applied to another case of correcting the wiring substrate. Here, a short-circuit portion (interlayer short-circuit and intra-layer short-circuit) 34 includes the lower-layer wiring 31 and a plurality of upper-layer wirings 33, in the multilayer film formed by stacking the lower-layer wiring 31, the interlayer insulator 32 and the upper-layer wiring 33, and the short-circuit has occurred due to mixing of foreign matter and so on. Specifically, the laser processing method can be applied to such a case where a part including the short-circuit portion 34 is removed as the laser cut portion 35 by laser etching under predetermined conditions. A defect correcting portion 36 is formed by burying the laser cut portion 35 if necessary as shown in the top view of FIG. 3A and the cross-sectional view of FIG. 3C.

In the laser processing method according to the embodiment of the present invention, first, a compressed gas is injected to the processing object 3 from the compressed gas supply unit 9 through the porous gas permeable film 13 to lift the local exhaust device 4 from the processing object 3 by a predetermined space. In this state, an area of the processing object 3 to be etched is irradiated with the laser light L and a part of the formed thin film pattern (for example, a part of excessively formed wires) is removed by laser etching.

In that case, the laser light L should preferably be pulse laser light with a pulse width of 10 picoseconds or less as mentioned hereinbefore. Also, it is preferable to select a wavelength of the pulse laser light L as well as a film thickness and reflectance of the multilayer film which becomes the irradiated portion of the processing object 3. Further, it is preferable to input this wavelength (together with film thickness and reflectance, if necessary) to the input unit which operates in associated with the laser light source unit so that such data is reflected on laser processing.

Figure 4A:
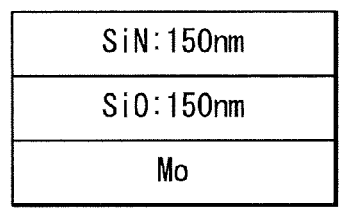
FIG. 4A is a schematic diagram showing an arrangement of an example of a multilayer film.

FIG. 4A shows a specific example of a multilayer film including a stacked structure and to which laser etching is carried out. Specifically, changes in reflectance depending on the film thicknesses of a silicon nitride (SiN) layer and a silicon oxide (SiO) film corresponding to the interlayer insulator are measured in advance. Processing is carried out by irradiating a multilayer film having a film thickness, with which reflectance higher than mean reflectance in a visible light region is indicated by at least a part of a plurality of wavelengths, with laser light of a wavelength corresponding to reflectance higher than the mean reflectance.

The specific example will be described more in detail.

Figure 4B:
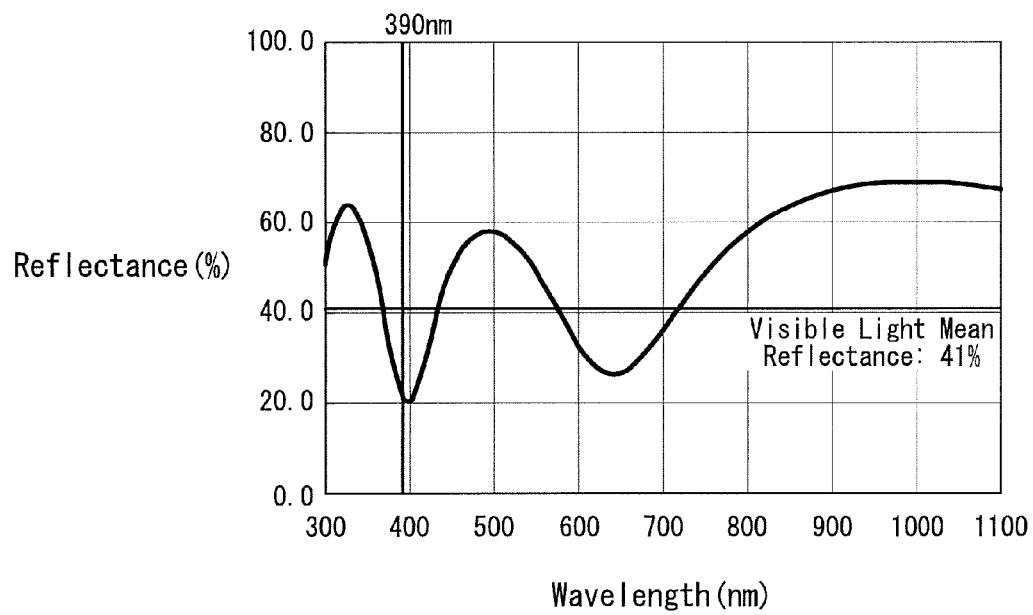
FIG. 4B is an explanatory diagram showing a reflection spectrum in the arrangement shown in FIG. 4A.

First, FIG. 4B shows a measured result (reflection spectrum) obtained when reflectance of the interlayer insulator was simulated where the silicon nitride layer has a film thickness of 150 nm and the silicon oxide layer has a film thickness of 150 nm. While the whole shape of the reflection spectrum changes in response to the film thickness, under this thickness condition, reflectance at a wavelength of 390 nm is considerably lower than mean reflectance (41%) in the visible light region. That is, reflectance becomes 22% and the remaining 78% may be absorbed by a Mo (molybdenum) layer.

Accordingly, under this film thickness condition, there is then a possibility that the molybdenum (Mo) layer located under the interlayer insulator may be damaged severely.

Figure 5A:
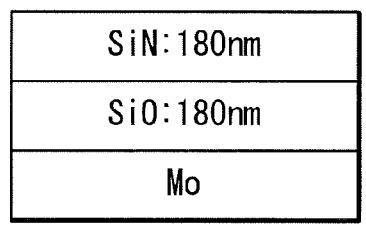
FIG. 5A is a schematic diagram showing an arrangement of another example of a multilayer film.
Figure 5B:
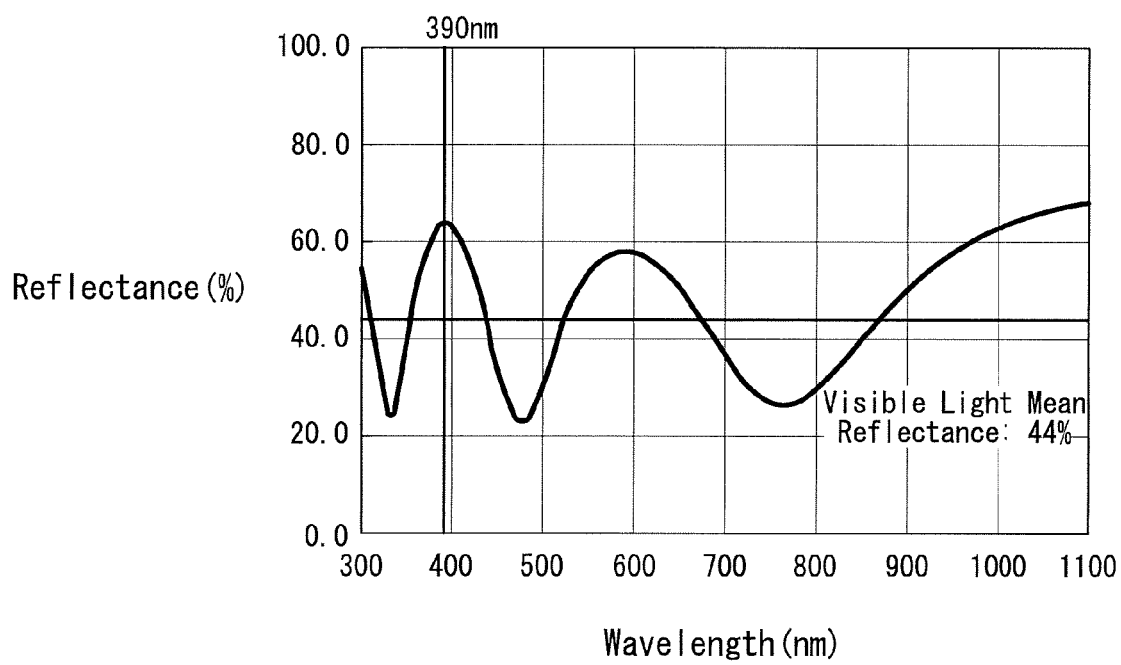
FIG. 5B is an explanatory diagram showing a reflection spectrum in the arrangement shown in FIG. 5A.

On the other hand, when a multilayer film having a stacked structure (thickness condition) shown in FIG. 5A is etched by laser, a reflection spectrum is changed as shown in FIG. 5B and reflectance at a wavelength of 390 nm shows a relative maximum value which is considerably higher than the mean reflectance (44%) of the visible light region. That is, since reflectance becomes 64% and the remaining 36% may be absorbed by the Mo layer, energy absorbed by the Mo layer becomes less than half the case of the arrangement shown in FIG. 4A. Thus, it becomes possible to suppress the damage to the lower layer.

Figure 2C:
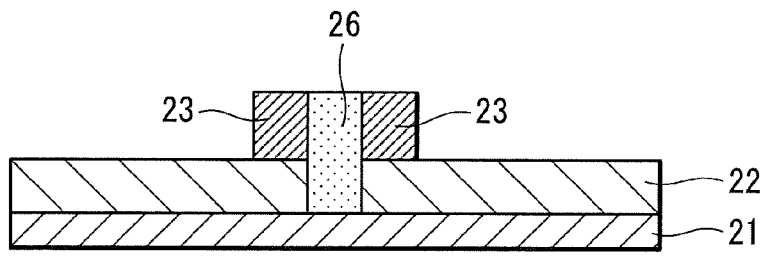
Figure 3C:
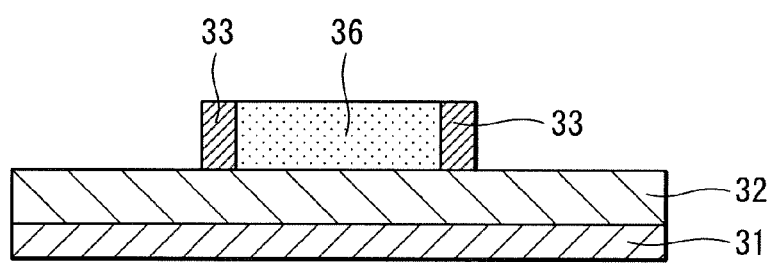

Therefore, under this thickness condition, when the material is processed by pulse laser light of a wavelength of 390 nm, damages to the molybdenum layer can be decreased. Accordingly, processing of correcting the short-circuit of the material can be carried out while the lower-layer wiring remains as shown in FIGS. 2C and 3C.

Here, laser energy density should preferably be selected from values obtained near threshold energy of the material of the upper-layer wiring. Since molybdenum (Mo) and aluminum (Al) are considered as the materials for the wires and a threshold value of Mo is 0.09 J/cm$^2$ and a threshold value of Al is 0.08 J/cm$^2$, it is preferable that the material should be processed at energy density near the threshold values, that is, energy density of 0.1 J/cm$^2$ or below.

If the material is processed at energy density higher than that value, there is a large possibility that the lower layer is damaged and there is a risk that selective processing may not be performed. Also, when the material is processed at energy density lower than that value, there is a large possibility that the film of the upper layer will not be removed completely. It should be noted that the laser cut area should preferably be larger than the short-circuit portion by approximately 1 μm to carry out correction with high reliability.

Figure 6A:
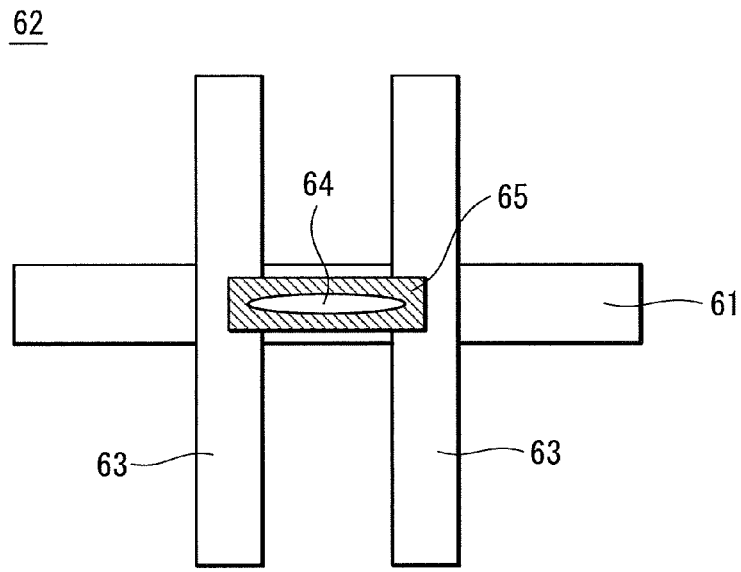
FIGS. 6A to 6C are respectively explanatory diagrams provided for explaining a laser processing method according to an embodiment of the present invention.
Figure 6B:
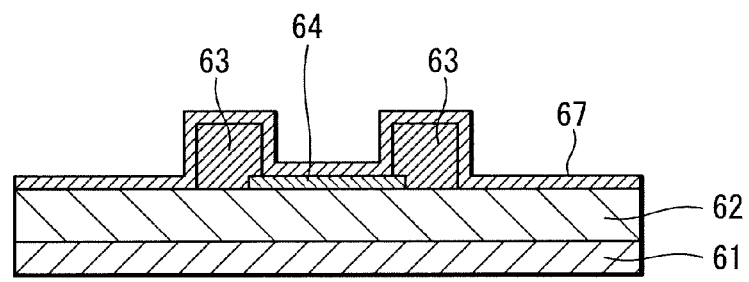

Further, as shown in a top view of FIG. 6A and a cross-sectional view of FIG. 6B, the laser processing method (method of manufacturing wiring substrate) according to the embodiment of the present invention can be applied to the following case. Here, a short-circuit portion (interlayer short-circuit and intra-layer short-circuit) 64 includes an lower-layer wiring 61 and a plurality of upper-layer wirings 63 and is caused in a multilayer film formed by stacking the lower-layer wiring 61, an interlayer insulator 62, the upper-layer wiring 63 and an upper-layer insulating film 67 due to mixing of foreign matter and so on. Specifically, a part including the short-circuit portion 64 is removed as a laser cut portion 65 by etching the part and in which a defect correction portion 66 is formed by burying the laser cut portion 65 if necessary, as shown in the top view of FIG. 6A and the cross-sectional view of FIG. 6C.

Specifically, the laser processing method according to the embodiment of the present invention can be applied to not only the case where the short-circuit portion is exposed as shown in the examples of FIGS. 2 and 3 but also the case where the short-circuit portion (and the upper-layer wiring) are covered with the upper-layer insulating film. As a result, the short-circuit can be corrected while damage to the upper-layer insulating film is being controlled.

In this case, changes in reflectance depending on the film thicknesses of a silicon nitride (SiN) layer and a silicon oxide (SiO) film corresponding to the upper-layer insulating film are measured in advance. Processing is carried out by irradiating a multilayer film having a film thickness, with which reflectance lower than mean reflectance in a visible light region is indicated by at least a part of a plurality of wavelengths, with laser light of a wavelength corresponding to reflectance lower than the mean reflectance. That is, a wavelength of laser light is selected so that reflection on the upper-layer insulating film having a specific film thickness may be suppressed.

The specific example will be described more in detail.

Figure 7A:
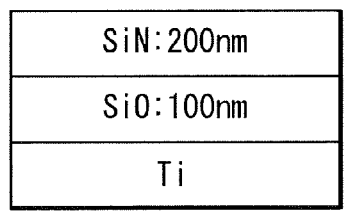
FIG. 7A is a schematic diagram showing an arrangement of still another example of a multilayer film.
Figure 7B:
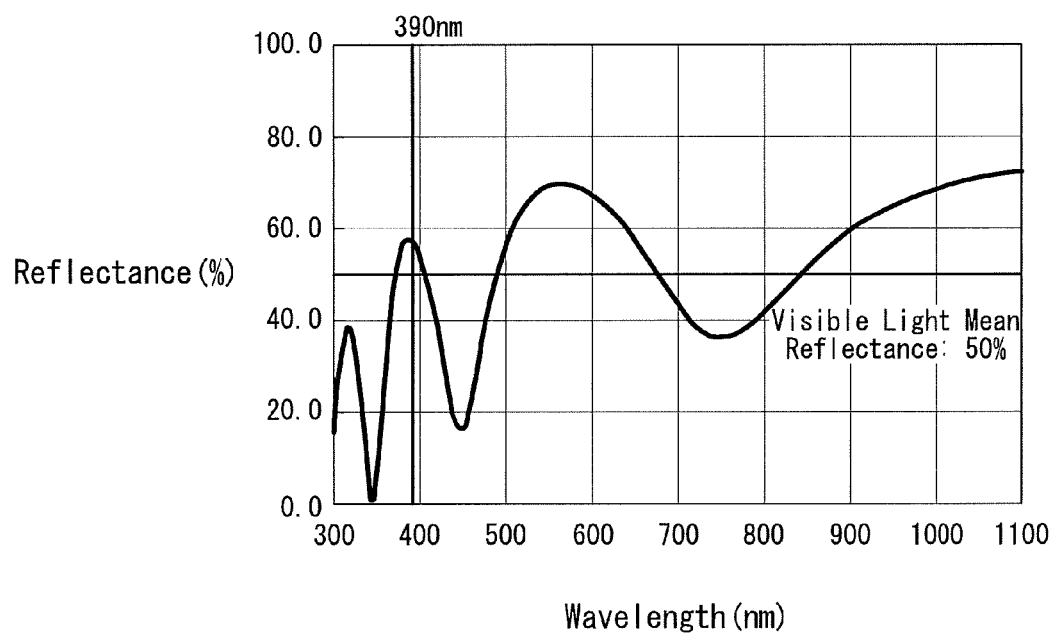
FIG. 7B is an explanatory diagram showing a reflection spectrum in the arrangement shown in FIG. 7A.

First, FIG. 7B shows a measured result (reflection spectrum) obtained when reflectance of the upper-layer insulating layer was simulated in a stacked structure (thickness condition) where the silicon nitride layer is 200 nm in thickness and the silicon oxide layer is 100 nm in thickness as shown in FIG. 7A. While the whole shape of the spectrum changes in response to the film thickness, under this thickness condition, reflectance at a wavelength of 390 nm is higher than mean reflectance (50%) in the visible light region. That is, reflectance becomes 57% and the remaining 43% can be absorbed by the Ti (titanium) layer.

Therefore, according to this thickness condition, there is a large possibility that the titanium layer located under the upper-layer insulating layer may be difficult to be processed.

Figure 8A:
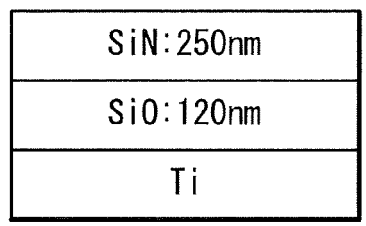
FIG. 8A is a schematic diagram showing an arrangement of a further another example of a multilayer film.
Figure 8B:
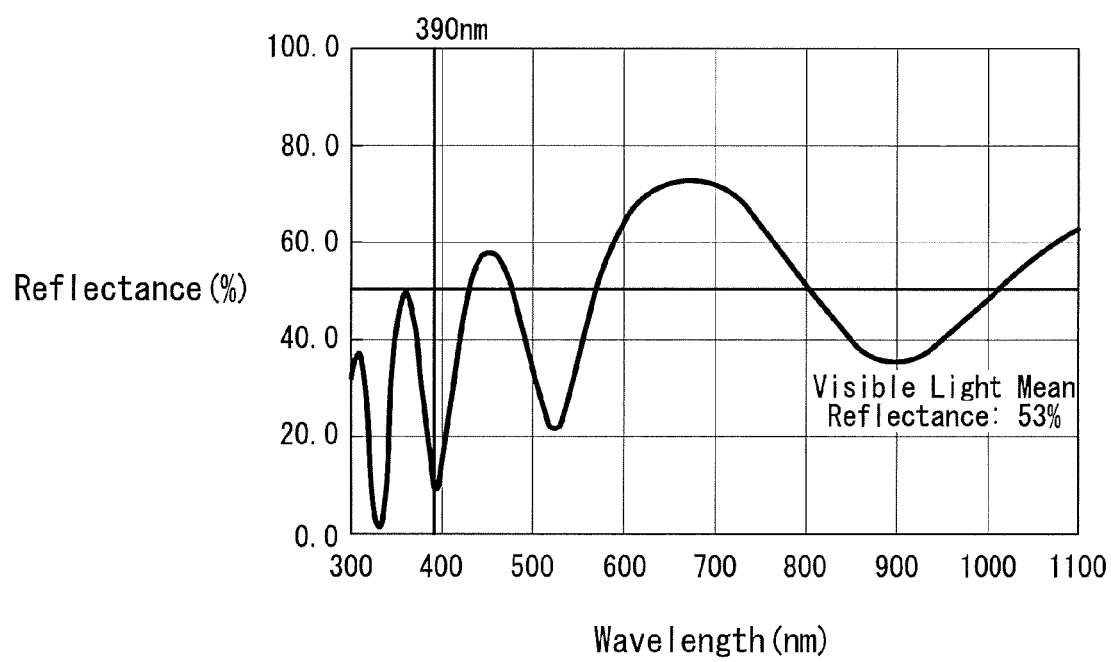
FIG. 8B is an explanatory diagram showing a reflection spectrum in the arrangement shown in FIG. 8A.

On the other hand, in an upper-layer insulating film having a stacked structure (thickness condition) shown in FIG. 8A, a reflection spectrum is changed as shown in FIG. 8B and reflectance at a wavelength of 390 nm becomes a relative minimum value considerably lower than mean reflectance (53%) in the visible light region. That is, reflectance in the upper-layer insulating film becomes 9.5% and the remaining 90.5% may be absorbed by the Ti layer (upper-layer wiring). Accordingly, in this case, as compared with the case of the arrangement shown in FIG. 7A, energy absorbed within the Ti layer is more than half the laser light so that a selective destruction (selective removal) of the Ti layer becomes possible although the Ti layer is covered with the upper-layer insulating layer.

Therefore, according to this thickness condition, energy absorbed by the titanium (Ti) layer when the material is processed by pulse laser light of a wavelength of 390 nm may be increased and processing to correct the short-circuit portion (short-circuit) becomes possible while the lower-layer wiring remaining.

Embodiment of Display Apparatus Manufacturing Method

According to the wiring substrate manufacturing method which is a specific example of the laser processing method of the embodiment of the present invention, it is possible to manufacture a light source device such as a backlight provided with a display apparatus such as a liquid-crystal display by combining the manufactured wiring substrate and other members.

Typically, display apparatuses are classified into a direct-light display apparatus and an edge-light (side-light) display apparatus based on an arrangement system of a light source device including fluorescent lamps.

The direct-light display apparatus has an arrangement in which a light source device including a plurality of fluorescent lamps is provided at the back (rear) opposite to the display surface (front). Since the direct-light display apparatus may use light from the light source device directly, it is advantageous for high luminance, high efficiency and large-scale but it is difficult to reduce in thickness and its power consumption is large.

On the other hand, the edge-light display apparatus has an arrangement in which an acryl-plate light guide portion (light guide) and a light source device are located at the back opposite to a display surface. Since light is diffused by the light guide portion, the edge-light display apparatus is advantageous for miniaturization, reduction in thickness and small power consumption but a large-screen display may suffer from the increase of weight. The edge-light display apparatuses are further classified into a backlight display apparatus in which a light source device is located behind the light guide portion and a front-light display apparatus in which a light source device is located in front of the light guide portion on the assumption that an optical device can generate reflected light.

According to the laser processing method of the aforementioned embodiment, it becomes possible to manufacture various display apparatus through manufacture of a wiring substrate without being limited to any of these types.

A specific example of a display apparatus obtained by manufacture of the aforementioned wiring substrate will be described with reference to FIG. 9.

Figure 9:
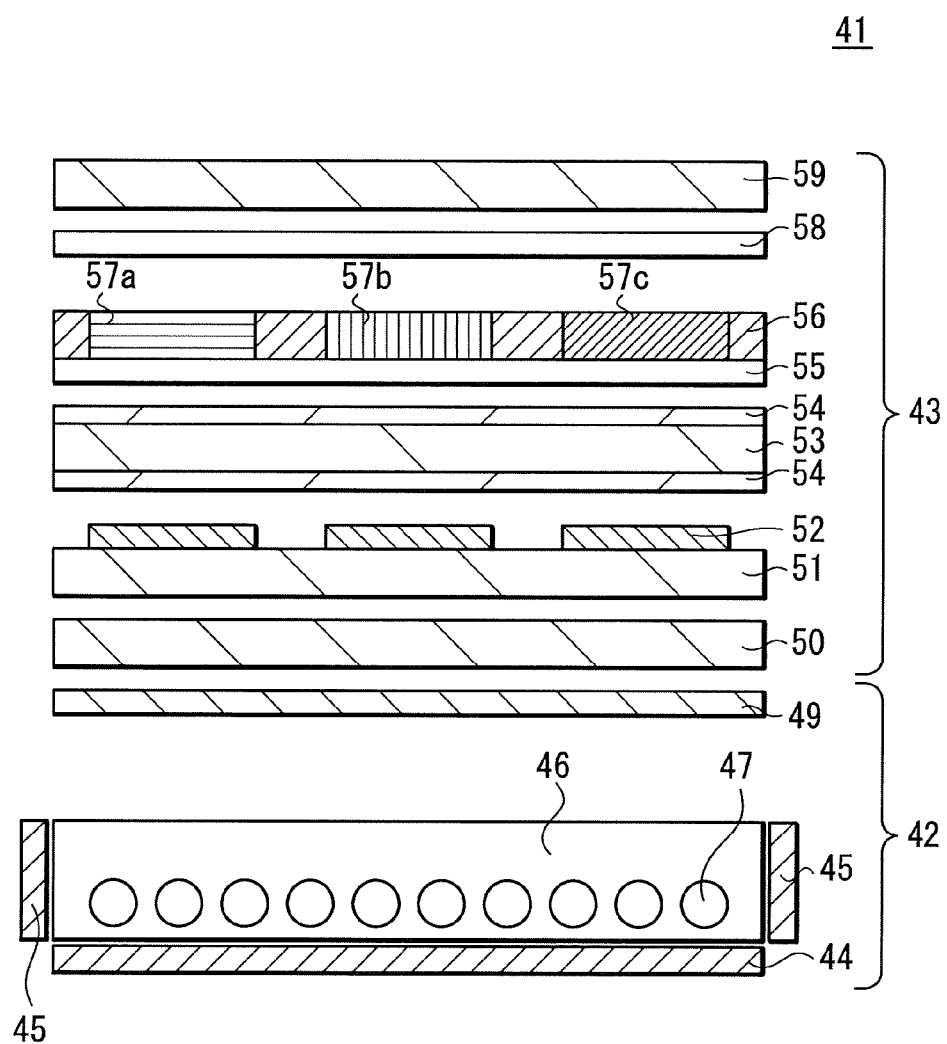
FIG. 9 is an explanatory diagram provided for explaining a display apparatus.

As shown in FIG. 9, a display apparatus 41 includes a light source device 42. Fluorescent lamps 47 are provided as light sources within a light guide portion 46 made of a resin in the light source device 42.

According to the embodiment of the present invention, the light source device 42 includes a diffusion sheet 49 at the closest portion to an optical device 43. The diffusion sheet 49 is adapted to uniformly guide surface-light from the fluorescent lamps 47 to the optical device 43. A reflector 44 is provided at the back of the light source device 42. Also, if necessary, a reflector 45 similar to the reflector 44 is provided at the side of the light guide portion 46.

It should be noted that, in the light source device 42 according to the embodiment of the present invention, various transparent resins can be used as a resin forming the light guide portion 46 in addition to epoxy resin, silicone resin and urethane resin.

Also, the display apparatus 41 includes the optical device (for example, liquid-crystal device) 43 capable of outputting predetermined output light by modulating light from the light source device 42. The aforementioned light source device 42 is located behind the optical device 43 and light is supplied from the light source device 42, which is a direct-light backlight, to the optical device 43.

The optical device 43 includes a deflection plate 50, a TFT (thin film transistor) glass substrate 51, dot-shaped electrodes 52 provided on the surface of the glass substrate 51, a liquid-crystal layer 53, orientation films 54 deposited on the front and back of the liquid-crystal layer 53, an electrode 55, and a plurality of black matrixes 56 on the electrode 55. Further, the optical device includes a first (red) color filter 57a, a second (green) color filter 57b and a third (blue) color filter 57c corresponding to pixels provided among the black matrixes 56 and a glass substrate 58 and a deflection plate 59 provided with a distance from the black matrixes 56 and the color filters 57a to 57c. All the components are located in this order from the side close to the optical device 42.

Here, the deflection plates 50 and 59 are adapted to form light which oscillates in specific directions. The TFT glass substrate 51, the dot-shaped electrodes 52 and the electrode 55 are provided to switch the liquid-crystal layer 53 which passes only light that oscillates in the specific direction. Since the orientation films 54 are also provided, then inclinations of liquid-crystal molecules within the liquid-crystal layer 53 can be arranged in a specific direction. Also, since the optical device 43 includes the black matrixes 56, contrast of light output from each of the color filters 57a to 57c corresponding to respective colors can be improved. It should be noted that the black matrixes 56 and the color filters 57a to 57c are attached to the glass substrate 58.

According to the laser processing method (wiring substrate manufacturing method) of the aforementioned embodiment of the present invention, for example, at least the TFT glass substrate 51 to the electrode 55 in the arrangement may be formed by using the resultant wiring substrate. Therefore, it is possible to correct the portion of a dead pixel or a dead line of pixels and to manufacture the light source device and the display apparatus. Hence, according to the light source device and the display apparatus including the wiring substrate, a yield can be improved and manufacture throughput can be reduced.

Example

An example (examined result) of a wiring substrate (array substrate) manufacturing method will be described as a specific example of the laser processing method according to an embodiment of the present invention.

The apparatus shown in FIGS. 1A and 1B was used, the thin film transistor (TFT) substrate was used as the processing object and laser processing was processed.

First, an inert gas of argon (Ar) or nitrogen ($N_2$) supplied from the compressed gas supply unit 9 was injected through the porous gas permeable film 13 within the local exhaust device 4 to the support table 2. The local exhaust device 4 was lifted to be higher than the thickness of the processing object 3, for example, with the height of 100 μm from the support table 2. Thus, the local exhaust device 4 and the processing object 3 can be avoided from contacting with each other in the next process even when the processing object 3 is slightly warped or wobbled.

Next, the support table 2 was moved in the horizontal direction and the processing object 3 was inserted into a space between the local exhaust device 4 and the support table 2. Afterward, the height of the local exhaust device 4 was selected to be 20 μm from the top of the processing object 3 and the support table 2 was moved in the horizontal direction so that the processing object 3 could be irradiated with the pulse laser light at its portion where short-circuit occurred. Thus, a relative position between the local exhaust device 4 and the processing object 3 was adjusted.

Next, only 5000 pulses of pulse laser light L having an irradiation beam shape of 10 μm-square were outputted from a pulse laser light source at a repetitive frequency of 100 Hz with a pulse width of 3 picoseconds. The processing object 3 was irradiated with such pulse laser light L through the transparent window 19. It should be noted that the laser light L was reshaped in beam shape by an aperture and the processing object 3 was processed while it was being observed by an irradiation observation unit with an objective lens at a magnification of 50 times in an operation distance of 15 mm.

Figure 10A:
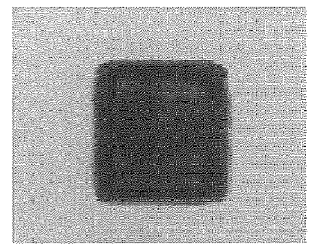
FIGS. 10A and 10B are respectively microscopic representations showing measured results provided for explaining a laser processing method according to an embodiment of the present invention.
Figure 10B:
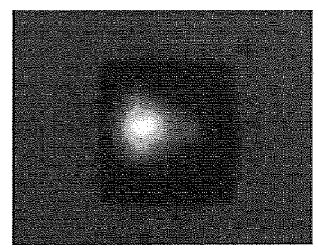

FIGS. 10A and 10B show photomicrographs obtained when the processing object having the reflection characteristics of the lower layer and the interlayer insulator shown in FIG. 4B was processed by laser and observed under microscope. From the results, it was confirmed that the lower-layer wiring had destruction.

Figure 11A:
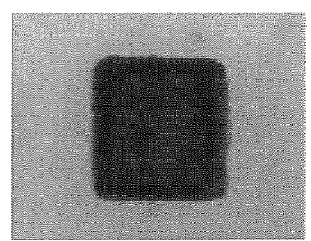
FIGS. 11A and 11B are respectively microscopic representations showing measured results of an example of a laser processing method according an embodiment of the present invention.
Figure 11B:
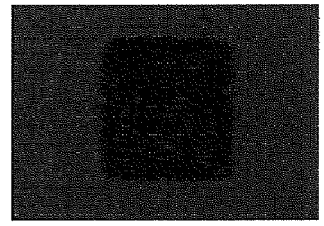

On the other hand, FIGS. 11A and 11B show photomicrographs obtained when the processing object having the reflection characteristics of the lower layer and the interlayer insulator shown in FIG. 5B was processed by laser and observed under microscope. From the results, it was confirmed that only the upper layer could be removed selectively without affecting the lower layer.

Figure 6C:
Figure 6C:
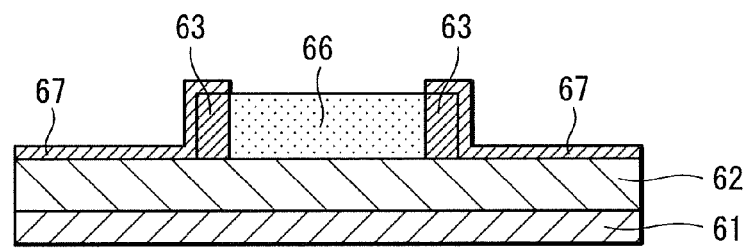
Figure 12:
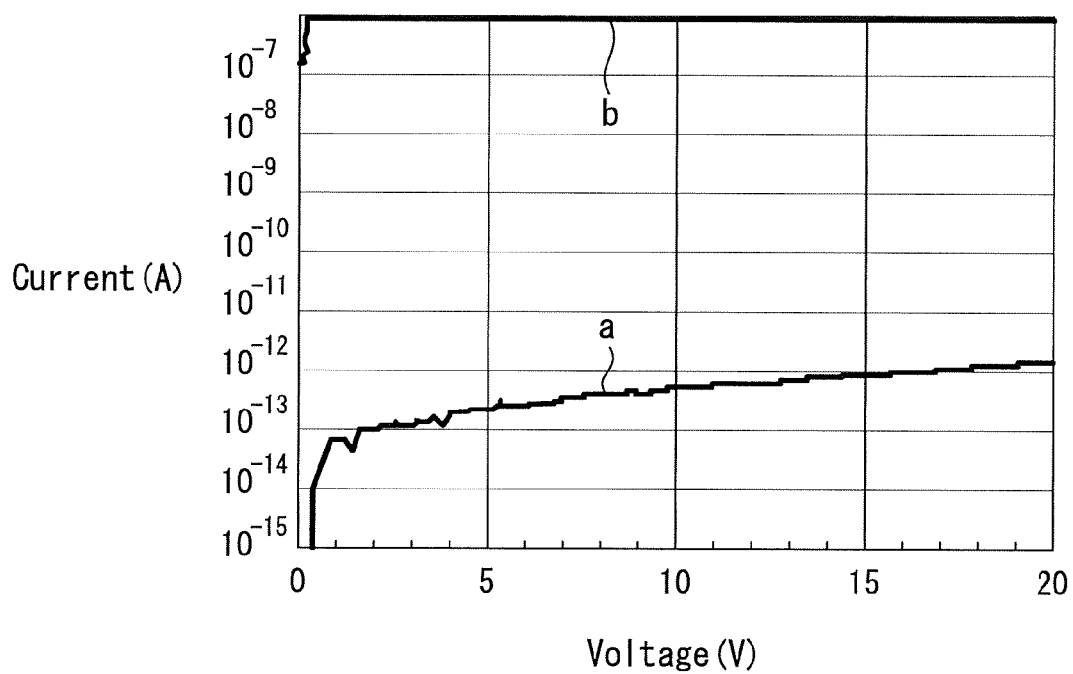
FIG. 12 is an explanatory diagram provided for explaining measured results of a leakage current.

A leakage current between the upper-layer wirings in the wiring substrate processed by laser was measured for the wiring substrate in which the upper layer insulating film was formed on the upper-layer wiring (see FIGS. 6A to 6C). FIG. 12 shows measured results in the form of a semi-logarithmic graph in which only the vertical axis shows a leakage current in the logarithmic representation.

In the wiring substrate in which the reflection characteristic of the upper layer insulating film is obtained as shown in FIG. 8B, as a result of removing the short-circuit portion by laser processing, resistance of the upper-layer wiring was not changed as shown by a solid line a in FIG. 12 (high resistance was maintained to suppress the leakage current). Therefore, it was confirmed that only the upper layer could be removed selectively.

On the other hand, in the wiring substrate in which the reflection characteristic of the upper layer insulating film was obtained as shown in FIG. 7B, a large-scale leakage current was generated as shown by a solid line b in FIG. 12 after it had been attempted to remove the short-circuit portion by laser processing. Thus, it was confirmed that the short-circuit portion was not removed.

As set forth above, according to the above-mentioned embodiments and the examples of the laser processing method, the wiring substrate manufacturing method and the display apparatus manufacturing method of the present invention, the processing object can be processed (manufactured) in more simplified and reliable manner as compared with the related art by using the aforementioned laser processing apparatus, for example. Therefore, both the improvement of manufacture yield and reduction of manufacture throughput can be obtained.

Also, according to the laser processing method and other embodiments of the present invention, since occurrence of interlayer short-circuit can be suppressed, defective products that should be scrapped can be decreased. Hence, productivity can be improved and a manufacturing cost can be decreased.

Also, while the aforementioned melt is affected by bonding properties of materials constituting the processing object members, a material with excellent thermal conduction such as metal tends to swell around the processed portion and the above-mentioned scattering distance is increased. Therefore, according to the laser processing method of the embodiment of the present invention, when a member with excellent thermal conduction is to be processed, it becomes possible to decrease dusts remarkably.

Further, since the thus obtained wiring substrate is manufactured such that irradiation of laser light on the multilayer film formed of two or more layers with different materials is carried out by selecting the wavelength of the above-described laser light based on the reflectance of the multilayer film. Therefore, the short-circuit portion can be removed reliably and the characteristics can be improved.

It should be noted that materials and amounts of the materials used and the numerical conditions such as processing time and dimensions described in the description of the above embodiment are only preferable examples and dimensions, shapes and arrangement relationships in the respective figures provided for explaining the present invention are schematic ones. That is, the present invention is not limited to those embodiments.

For example, if the laser processing apparatus according to the embodiment of the present invention includes a heating device (not shown) for heating the processing object members and the inert gas, then occurrence of dusts can be suppressed, because a fall of a temperature around a vaporized material produced by laser irradiation causes the vaporized material to be solidified and causes redeposition.

Such a heating device can be prepared by modifying the laser processing apparatus 1 such that a heater is provided in the inside of or on the outside of the local processing head 4 and the support table 2. It is desirable that a heating temperature should be selected to be appropriate such that a thermal load may not be excessively applied to the above-mentioned porous gas permeable film 13 and the raw material supply unit 5, for example, about 200° C. If such heating device is provided on the local processing head 4, it is possible to avoid temperatures of the members and inert gas from being lowered.

Also, the interlayer insulators are not limited to the arrangements shown in FIGS. 4A, 5A, 7A and 8A and the number of interlayer insulators may be changed. It is possible to select optimum conditions for processing similarly to the embodiment of the present invention by optimizing film thicknesses of respective layers in a manner such that reflectance of the multilayer film formed of the lower-layer wiring and the interlayer insulator may agree with the relative maximum peak in the used laser wavelength.

Also, in the processing object including the upper layer insulating film, the stacked structure (number of layers and materials) of the upper layer insulating film is not limited to the aforementioned stacked structure. Specifically, in the processing (manufacture) of an object including an upper layer insulating film of a stacked structure different from the aforementioned stacked structure, optimum conditions for processing can be selected similarly to the embodiment of the present invention. Accordingly, such similar result can be obtained by optimizing film thicknesses of respective layers in a manner such that both of reflectance of the multilayer film including the upper-layer wiring and reflectance of the upper layer insulating film on the multilayer film may agree with a relative minimum peak in the used laser wavelength. Thus, the present invention can be modified and changed variously as described above.

It should be understood by those skilled in the art that various modifications, combinations, sub-combinations and alterations may occur depending on design requirements and other factors insofar as they are within the scope of the appended claims or the equivalents thereof.

What is claimed is:

1. A laser processing apparatus comprising:
   a support table for supporting a processing object;
   a local exhaust device that directs a laser light into a local exhaust unit where a pressure in the local exhaust unit is locally adjusted over the support table;
   a compressed gas supply unit in the local exhaust device; and
   a laser light source unit that outputs the laser light, wherein,
      the compressed gas supply unit in the local exhaust device injects a compressed gas between the local exhaust device and the processing object to lift the local exhaust device from the processing object;
      the processing object includes a multilayer film formed of two or more layers with different materials; and
      an input unit into which reflectance of the processing object is inputted is connected to the laser light source unit.

2. A laser processing method for irradiating a processing object with laser light, comprising the steps of:
   selecting a wavelength of the laser light based on reflectance of a multilayer film formed of two or more layers with different materials;
   lifting a local exhaust device from the processing object by means of a compressed gas supply unit in the local exhaust device that injects a compressed gas between the processing object and the local exhaust device; and
   irradiating the processing object with the laser light to perform laser processing.

3. A laser processing method according to claim 2, further comprising the steps of:
   measuring a change of reflectance that is based on a film thickness of the multilayer film over a plurality of wavelengths of the laser light;
   selecting a thickness of the multilayer film so that at least a part of the plurality of wavelengths indicates a reflectance higher than a mean reflectance in a visible light region; and
   processing the processing object by irradiating the multilayer film with laser light of a wavelength corresponding to a reflectance higher than the mean reflectance.

4. A laser processing method according to claim 2, further comprising the steps of:
   measuring in advance a change of reflectance depending on a film thickness of the multilayer film on a plurality of wavelengths of the laser light;
   selecting a thickness of the multilayer film so that a relative maximum value of reflectance is obtained on at least a part of the plurality of wavelengths; and
   processing the processing object by irradiating the multilayer film with laser light of a wavelength corresponding to the relative maximum value.

5. A laser processing method according to claim 2, wherein the laser light is pulse laser light a pulse width of which is 10 picoseconds or less.

6. A laser processing method according to claim 2, wherein the laser light is pulse laser light having energy density per pulse of 0.1 J/cm$^2$ or less.

7. A laser processing method according to claim 2, wherein the multilayer film represents an intersecting portion in which different conductive members having different heights intersect each other through insulating films.

8. A laser processing method according to claim 2, further comprising the steps of:
   providing the processing object with an upper-layer insulating film on the multilayer film;
   measuring a change of reflectance on respective film thicknesses of the upper-layer insulating film and the multilayer film over a plurality of wavelengths of the laser light that is based;
   selecting respective thicknesses of the upper-layer insulating film and the multilayer film so that at least a part of the plurality of wavelengths indicates a reflectance lower than a mean reflectance in a visible light region; and
   processing the processing object by irradiating the upper-layer insulating film and the multilayer film with laser light of a wavelength corresponding to a reflectance lower than the mean reflectance.

9. A laser processing method according to claim 2, further comprising the steps of:
   providing the processing object with an upper-layer insulating film on the multilayer film;
   measuring a change of reflectance on respective film thicknesses of the upper-layer insulating film and the multilayer film over a plurality of wavelengths of the laser light this is based that is based;
   selecting respective thicknesses of the upper-layer insulating film and the multilayer film so that a relative minimum value of reflectance is obtained on at least a part of the plurality of wavelengths; and
   processing the processing object by irradiating the upper-layer insulating film and the multilayer film with laser light of a wavelength corresponding to the relative minimum value.

10. A method of manufacturing a wiring substrate by laser processing, comprising the steps of:

forming a multilayer film including two or more layers with different materials;

lifting a local exhaust device from the multilayer film by means of a compressed gas supply unit in the local exhaust device that injects a compressed gas between the multilayer film and the local exhaust device;

irradiating the multilayer film with a laser light having a wavelength that is selected based on a reflectance of the multilayer film; and manufacturing the wiring substrate.

11. A method of manufacturing a display apparatus including a wiring substrate, comprising the steps of:

forming a multilayer film including two or more layers with different materials;

lifting a local exhaust device from the multilayer film by means of a compressed gas supply unit in the local exhaust device that injects a compressed gas between the multilayer film and the local exhaust device;

irradiating the multilayer ffilm with a laser light having a wavelength that is selected based on a reflectance of the multilayer film; and manufacturing the wiring substrate to be included in the display apparatus.

12. A wiring substrate manufactured by lifting a local exhaust device from a multilayer film that includes two or more layers with materials different from each other by means of a compressed gas supply unit in the local exhaust device that injects a compressed gas between the multilayer film and the local exhaust device; and irradiating the multilayer film with a laser light having a wavelength that is based on reflectance of the multilayer film.

\* \* \* \* \*